United States Patent
McElrea et al.

(10) Patent No.: US 8,872,318 B2
(45) Date of Patent: Oct. 28, 2014

(54) THROUGH INTERPOSER WIRE BOND USING LOW CTE INTERPOSER WITH COARSE SLOT APERTURES

(75) Inventors: Simon McElrea, San Jose, CA (US); Wael Zohni, San Jose, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 436 days.

(21) Appl. No.: 13/216,465

(22) Filed: Aug. 24, 2011

(65) Prior Publication Data

US 2013/0049196 A1    Feb. 28, 2013

(51) Int. Cl.
| | |
|---|---|
| *H01L 23/48* | (2006.01) |
| *H01L 29/40* | (2006.01) |
| *H01L 23/498* | (2006.01) |
| *H01L 21/48* | (2006.01) |
| *H01L 25/065* | (2006.01) |
| *H01L 23/13* | (2006.01) |
| *H01L 23/00* | (2006.01) |

(52) U.S. Cl.
CPC ....... *H01L 24/73* (2013.01); *H01L 2924/19105* (2013.01); *H01L 2224/48227* (2013.01); *H01L 2224/16227* (2013.01); *H01L 24/48* (2013.01); *H01L 24/32* (2013.01); *H01L 2225/06513* (2013.01); *H01L 2225/0651* (2013.01); *H01L 2225/06565* (2013.01); *H01L 2224/131* (2013.01); *H01L 2924/19107* (2013.01); *H01L 2224/32145* (2013.01); *H01L 2224/4824* (2013.01); *H01L 2225/06517* (2013.01); *H01L 2224/13144* (2013.01); *H01L 2224/13111* (2013.01); *H01L 23/49811* (2013.01); *H01L 24/16* (2013.01); *H01L 24/97* (2013.01); *H01L 2224/73265* (2013.01); *H01L 2224/13109* (2013.01); *H01L 2224/97* (2013.01); *H01L 2225/06562* (2013.01); *H01L 2224/32225* (2013.01); *H01L 2225/06541* (2013.01); *H01L 2224/73253* (2013.01); *H01L 2224/13147* (2013.01); *H01L 21/486* (2013.01); *H01L 25/0657* (2013.01); *H01L 23/49827* (2013.01); *H01L 23/13* (2013.01); *H01L 2224/16145* (2013.01); *H01L 2224/73215* (2013.01); *H01L 2225/06558* (2013.01); *H01L 2924/15311* (2013.01); *H01L 2224/73204* (2013.01)
USPC .......................... 257/686; 257/276; 257/777

(58) Field of Classification Search
None
See application file for complete search history.

(56) References Cited

U.S. PATENT DOCUMENTS

| | | | |
|---|---|---|---|
| 3,900,153 | A | 8/1975 | Beerwerth et al. |
| 4,695,870 | A | 9/1987 | Patraw |

(Continued)

FOREIGN PATENT DOCUMENTS

DE          10023823         12/2001

OTHER PUBLICATIONS

U.S. Appl. No. 12/839,038.

*Primary Examiner* — James Mitchell
(74) *Attorney, Agent, or Firm* — Lerner, David, Littenberg, Krumholz & Mentlik, LLP

(57) ABSTRACT

A microelectronic package includes a subassembly, a second substrate, and a monolithic encapsulant. The subassembly includes a first substrate that has at least one aperture, a coefficient of thermal expansion (CTE) of eight parts per million per degree Celsius or less, and first and second contacts arranged so as to have a pitch of 200 microns or less. First and second microelectronic elements are respectively electrically connected to the first and second contacts. Wire bonds may be used to connect the second element contacts with the second contacts. A second substrate may underlie either the first or the second microelectronic elements and be electrically interconnected with the first substrate. The second substrate may have terminals configured for electrical connection to a component external to the microelectronic package. A monolithic encapsulant may contact the first and second microelectronic elements and the first and second substrates.

13 Claims, 11 Drawing Sheets

(56) References Cited

U.S. PATENT DOCUMENTS

| | | |
|---|---|---|
| 4,716,049 A | 12/1987 | Patraw |
| 4,804,132 A | 2/1989 | DiFrancesco |
| 4,878,611 A | 11/1989 | LoVasco et al. |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,222,014 A | 6/1993 | Lin |
| 5,247,423 A | 9/1993 | Lin et al. |
| 5,340,771 A | 8/1994 | Rostoker |
| 5,397,997 A | 3/1995 | Tuckerman et al. |
| 5,422,435 A | 6/1995 | Takiar et al. |
| 5,455,390 A | 10/1995 | DiStefano et al. |
| 5,495,398 A | 2/1996 | Takiar et al. |
| 5,502,289 A | 3/1996 | Takiar et al. |
| 5,518,964 A | 5/1996 | DiStefano et al. |
| 5,615,824 A | 4/1997 | Fjelstad et al. |
| 5,656,550 A | 8/1997 | Tsuji et al. |
| 5,659,952 A | 8/1997 | Kovac et al. |
| 5,679,977 A | 10/1997 | Khandros et al. |
| 5,731,709 A | 3/1998 | Pastore et al. |
| 5,736,780 A | 4/1998 | Murayama |
| 5,802,699 A | 9/1998 | Fjelstad et al. |
| 5,811,982 A | 9/1998 | Beaman et al. |
| 5,854,507 A | 12/1998 | Miremadi et al. |
| 5,912,505 A | 6/1999 | Itoh et al. |
| 5,971,253 A | 10/1999 | Gilleo et al. |
| 5,973,391 A | 10/1999 | Bischoff et al. |
| 5,980,270 A | 11/1999 | Fjelstad et al. |
| 5,998,864 A | 12/1999 | Khandros et al. |
| 6,032,359 A | 3/2000 | Carroll |
| 6,038,136 A | 3/2000 | Weber |
| 6,052,287 A | 4/2000 | Palmer et al. |
| 6,054,756 A | 4/2000 | DiStefano et al. |
| 6,077,380 A | 6/2000 | Hayes et al. |
| 6,124,546 A | 9/2000 | Hayward et al. |
| 6,177,636 B1 | 1/2001 | Fjelstad |
| 6,194,250 B1 | 2/2001 | Melton et al. |
| 6,202,297 B1 | 3/2001 | Faraci et al. |
| 6,258,625 B1 | 7/2001 | Brofman et al. |
| 6,300,163 B1 * | 10/2001 | Akram .................. 438/108 |
| 6,332,270 B2 | 12/2001 | Beaman et al. |
| 6,358,627 B2 | 3/2002 | Benenati et al. |
| 6,362,525 B1 | 3/2002 | Rahim |
| 6,445,594 B1 | 9/2002 | Nakagawa et al. |
| 6,458,411 B1 | 10/2002 | Goossen et al. |
| 6,495,914 B1 | 12/2002 | Sekine et al. |
| 6,507,098 B1 * | 1/2003 | Lo et al. .................. 257/686 |
| 6,507,104 B2 | 1/2003 | Ho et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,624,653 B1 | 9/2003 | Cram |
| 6,647,310 B1 | 11/2003 | Yi et al. |
| 6,762,488 B2 * | 7/2004 | Maeda et al. .................. 257/686 |
| 6,765,287 B1 | 7/2004 | Lin et al. |
| 6,861,288 B2 * | 3/2005 | Shim et al. .................. 438/109 |
| 6,902,869 B2 | 6/2005 | Appelt et al. |
| 6,930,256 B1 | 8/2005 | Huemoeller et al. |
| 6,987,032 B1 | 1/2006 | Fan et al. |
| 7,045,884 B2 | 5/2006 | Standing |
| 7,067,911 B1 | 6/2006 | Lin et al. |
| 7,176,559 B2 | 2/2007 | Ho et al. |
| 7,185,426 B1 | 3/2007 | Hiner et al. |
| 7,205,656 B2 * | 4/2007 | Kim et al. .................. 257/723 |
| 7,215,033 B2 | 5/2007 | Lee et al. |
| 7,233,057 B2 | 6/2007 | Hussa |
| 7,323,767 B2 | 1/2008 | James et al. |
| 7,372,151 B1 | 5/2008 | Fan et al. |
| 7,408,245 B2 * | 8/2008 | Hung et al. .................. 257/666 |
| 7,485,562 B2 | 2/2009 | Chua et al. |
| 7,514,776 B2 * | 4/2009 | Vaiyapuri .................. 257/686 |
| 7,633,765 B1 | 12/2009 | Scanlan et al. |
| 7,638,880 B2 * | 12/2009 | Shen et al. .................. 257/777 |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,763,961 B2 * | 7/2010 | Park et al. .................. 257/678 |
| 7,911,046 B2 * | 3/2011 | Cablao et al. .................. 257/686 |
| 8,111,523 B2 * | 2/2012 | Sunohara et al. .................. 361/781 |
| 2002/0043709 A1 | 4/2002 | Yeh et al. |
| 2002/0053727 A1 | 5/2002 | Kimura |
| 2002/0074630 A1 | 6/2002 | Ando et al. |
| 2002/0121687 A1 | 9/2002 | Winderl |
| 2002/0125571 A1 | 9/2002 | Corisis et al. |
| 2002/0153602 A1 | 10/2002 | Tay et al. |
| 2002/0190396 A1 | 12/2002 | Brand |
| 2003/0057544 A1 | 3/2003 | Nathan et al. |
| 2003/0102546 A1 | 6/2003 | Lee et al. |
| 2003/0124767 A1 | 7/2003 | Lee et al. |
| 2003/0164540 A1 | 9/2003 | Lee et al. |
| 2003/0183930 A1 | 10/2003 | Fukasawa |
| 2004/0026773 A1 | 2/2004 | Koon et al. |
| 2004/0036164 A1 | 2/2004 | Koike et al. |
| 2004/0038447 A1 | 2/2004 | Corisis et al. |
| 2004/0061211 A1 * | 4/2004 | Michii et al. .................. 257/686 |
| 2004/0075164 A1 | 4/2004 | Pu et al. |
| 2004/0090756 A1 | 5/2004 | Ho et al. |
| 2004/0090759 A1 | 5/2004 | Kim |
| 2004/0110319 A1 | 6/2004 | Fukutomi et al. |
| 2004/0160751 A1 | 8/2004 | Inagaki et al. |
| 2004/0262734 A1 | 12/2004 | Yoo |
| 2005/0035440 A1 | 2/2005 | Mohammed |
| 2005/0082664 A1 | 4/2005 | Funaba et al. |
| 2005/0104196 A1 | 5/2005 | Kashiwazaki |
| 2005/0116326 A1 | 6/2005 | Haba et al. |
| 2005/0173805 A1 | 8/2005 | Damberg et al. |
| 2005/0181544 A1 | 8/2005 | Haba et al. |
| 2005/0181655 A1 | 8/2005 | Haba et al. |
| 2005/0284658 A1 | 12/2005 | Kubota et al. |
| 2005/0285246 A1 | 12/2005 | Haba et al. |
| 2006/0172457 A1 * | 8/2006 | Huang .................. 438/106 |
| 2006/0202317 A1 | 9/2006 | Barakat et al. |
| 2006/0290005 A1 | 12/2006 | Thomas et al. |
| 2007/0148822 A1 | 6/2007 | Haba et al. |
| 2007/0222054 A1 * | 9/2007 | Hembree .................. 257/686 |
| 2007/0252260 A1 * | 11/2007 | Chee et al. .................. 257/686 |
| 2008/0042249 A1 * | 2/2008 | Haba .................. 257/686 |
| 2008/0105984 A1 * | 5/2008 | Lee .................. 257/777 |
| 2008/0136005 A1 | 6/2008 | Lee et al. |
| 2008/0284045 A1 | 11/2008 | Gerber et al. |
| 2008/0315385 A1 | 12/2008 | Gerber et al. |
| 2009/0045524 A1 * | 2/2009 | Mohammed et al. .................. 257/777 |
| 2009/0104736 A1 | 4/2009 | Haba et al. |
| 2009/0115043 A1 * | 5/2009 | Chow et al. .................. 257/686 |
| 2009/0189293 A1 * | 7/2009 | Suzuki et al. .................. 257/777 |
| 2009/0256267 A1 * | 10/2009 | Yang et al. .................. 257/777 |
| 2010/0084754 A1 * | 4/2010 | Yoo et al. .................. 257/686 |
| 2010/0232129 A1 | 9/2010 | Haba et al. |
| 2010/0264521 A1 * | 10/2010 | Wood et al. .................. 257/621 |
| 2011/0169154 A1 * | 7/2011 | Kweon et al. .................. 257/686 |
| 2011/0266652 A1 * | 11/2011 | Do et al. .................. 257/528 |

* cited by examiner

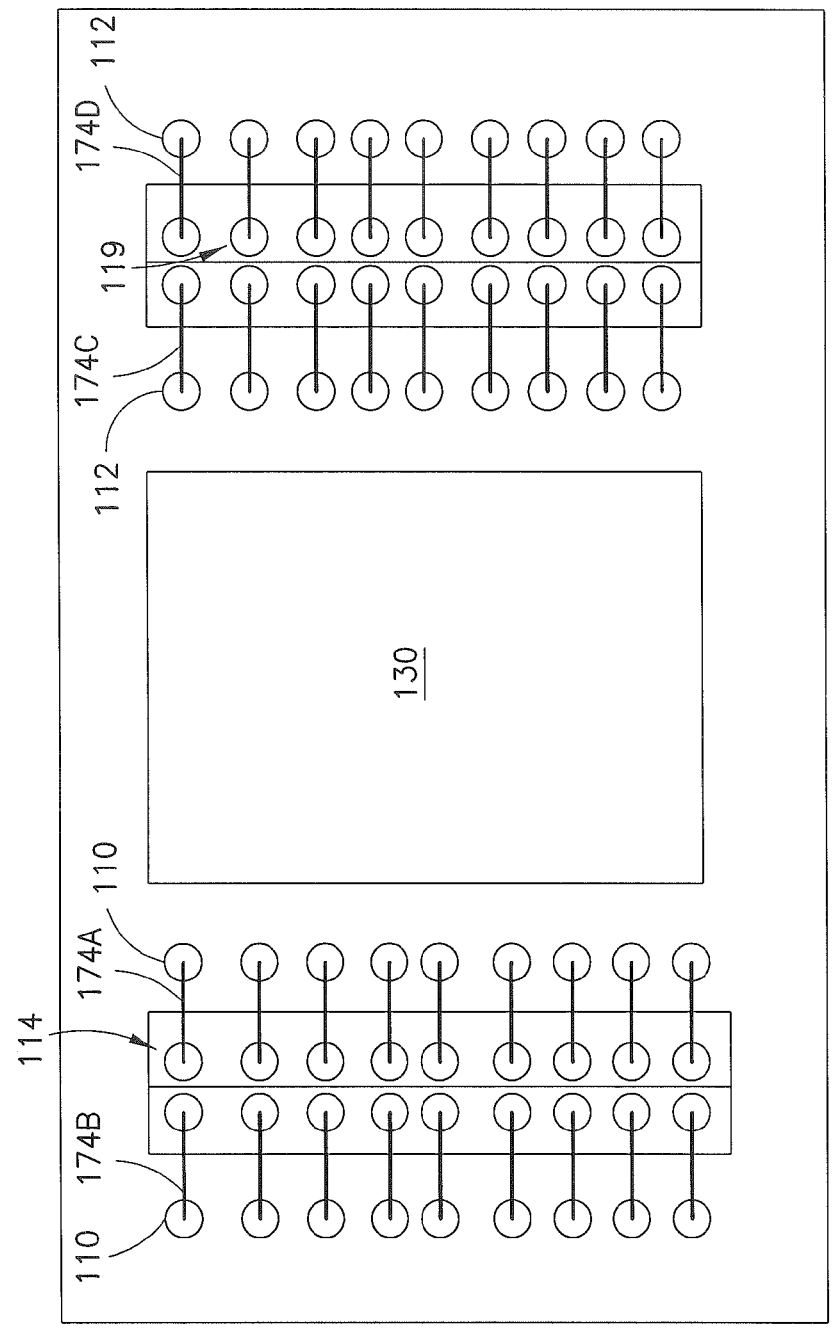

THROUGH INTERPOSER WIRE BOND USING LOW CTE INTERPOSER WITH COARSE SLOT APERTURES

BACKGROUND OF THE INVENTION

The present invention relates to improved microelectronic packages and to methods of making such packages.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier.

Despite the advances that have been made in semiconductor packaging, there is still a need for improvements which may help to reduce the overall size of the package, while enhancing electrical interconnection reliability. These attributes of the present invention are achieved by the construction of the microelectronic packages and methods of making the microelectronic packages as described hereinafter.

BRIEF SUMMARY OF THE INVENTION

In one aspect of an embodiment of the present invention, a microelectronic package includes a subassembly, a second substrate, and a monolithic encapsulant. The subassembly includes a first substrate, and first and second microelectronic elements. The first substrate may have a coefficient of thermal expansion ("CTE") of eight parts per million per degree Celsius or less. The substrate has a first surface, a second surface opposite the first surface, and at least one aperture extending between the first and second surfaces. The first surface of the substrate has first contacts and second contacts thereon. The contacts are arranged so as to have a pitch of 200 microns or less. The first microelectronic element is arranged so that the front surface faces the first surface of the first substrate and first element contacts at the front surface are joined to the first contacts. A second microelectronic element has a front surface facing the second surface of the substrate. The second microelectronic element has second element contacts at the front surface thereof aligned with the at least one aperture. Wire bonds may connect the second element contacts with the second contacts, and at least portions of the wire bonds are aligned with the at least one aperture. The second substrate underlies either the first or the second microelectronic element and is electrically interconnected with the first substrate. The second substrate may have terminals configured for electrical connection to a component external to the microelectronic package. A monolithic encapsulant contacts the first and second microelectronic elements and the first and second substrates.

In an alternative embodiment of this aspect of the invention, the encapsulant fully encapsulates the first and second microelectronic elements. Alternatively, a rear surface of at least one of the first or second microelectronic elements is exposed at a surface of the encapsulant, and at least one of the edge surfaces of the at least one microelectronic element is covered by the encapsulant.

In another alternative embodiment, the package further comprises second wire bonds that electrically interconnect the first and second substrates.

In still another alternative embodiment, electrically conductive spacer elements can be used to interconnect the first and second substrates. Alternatively, the electrically conductive spacer elements can include solder balls joined to electrically conductive elements on surfaces of the first and second substrate facing one another. The electrically conductive spacer elements may alternatively include electrically conductive posts consisting essentially of copper or copper alloy projecting from a surface of at least one of the first or second substrates towards a surface of at least one of the other first or second substrates.

In another aspect of the present invention, a microelectronic package includes a subassembly that has first and second substrates, first and second microelectronic elements, and a monolithic encapsulant that contacts the first and second microelectronic elements and the first and second substrates. The first substrate has a CTE of eight parts per million per degree Celsius or less. The substrate has a first surface, a second surface opposite the first surface, and first and second contacts thereon. The first contacts may have a pitch of 200 microns or less. The first microelectronic element has a front surface that faces the first surface. First element contacts at the front surface may be joined to the first contacts. The second substrate underlies either the first or the second surfaces of the first substrate and is electrically interconnected with the first substrate. The second substrate has terminals configured for electrical connection to a component external to the microelectronic package. The second microelectronic element is electrically interconnected with the second substrate.

In an alternative embodiment of this aspect of the invention, the first substrate has an aperture extending between the first and second surfaces thereof. The first and second substrates are electrically interconnected by wire bonds extending through the aperture.

In an alternative embodiment of this aspect of the invention, the second microelectronic element has a front surface facing the first microelectronic element and wire bonds electrically connecting the second microelectronic element with the first substrate.

In an alternative embodiment of this aspect of the invention, the second microelectronic element has a front surface facing the first microelectronic element and wire bonds electrically connecting the second microelectronic element with the second substrate.

In an alternative embodiment of this aspect of the invention, there is a third microelectronic element that has a front surface and a rear surface. The front surface of the third microelectronic element faces the first substrate and is electrically connected to the first substrate.

In an alternative embodiment of this aspect of the invention, a wire bond electrically connects the third microelectronic element with the first substrate.

In an alternative embodiment of this aspect of the invention, there is a third microelectronic element that has a front surface and a rear surface. The second microelectronic element may have conductive vias extending between its front and rear surfaces. The third microelectronic element may be electrically connected to the second substrate through the conductive vias.

A system may include the microelectronic packages of the previously discussed aspects of the invention, and one or more other electronic components electrically connected with the assembly. Alternatively, the system further includes a housing and the package and the other electronic components may be mounted to the housing.

BRIEF DESCRIPTION OF THE DRAWINGS

FIG. 1A is a top plan view of FIG. 2.

DETAILED DESCRIPTION

Figure 1:
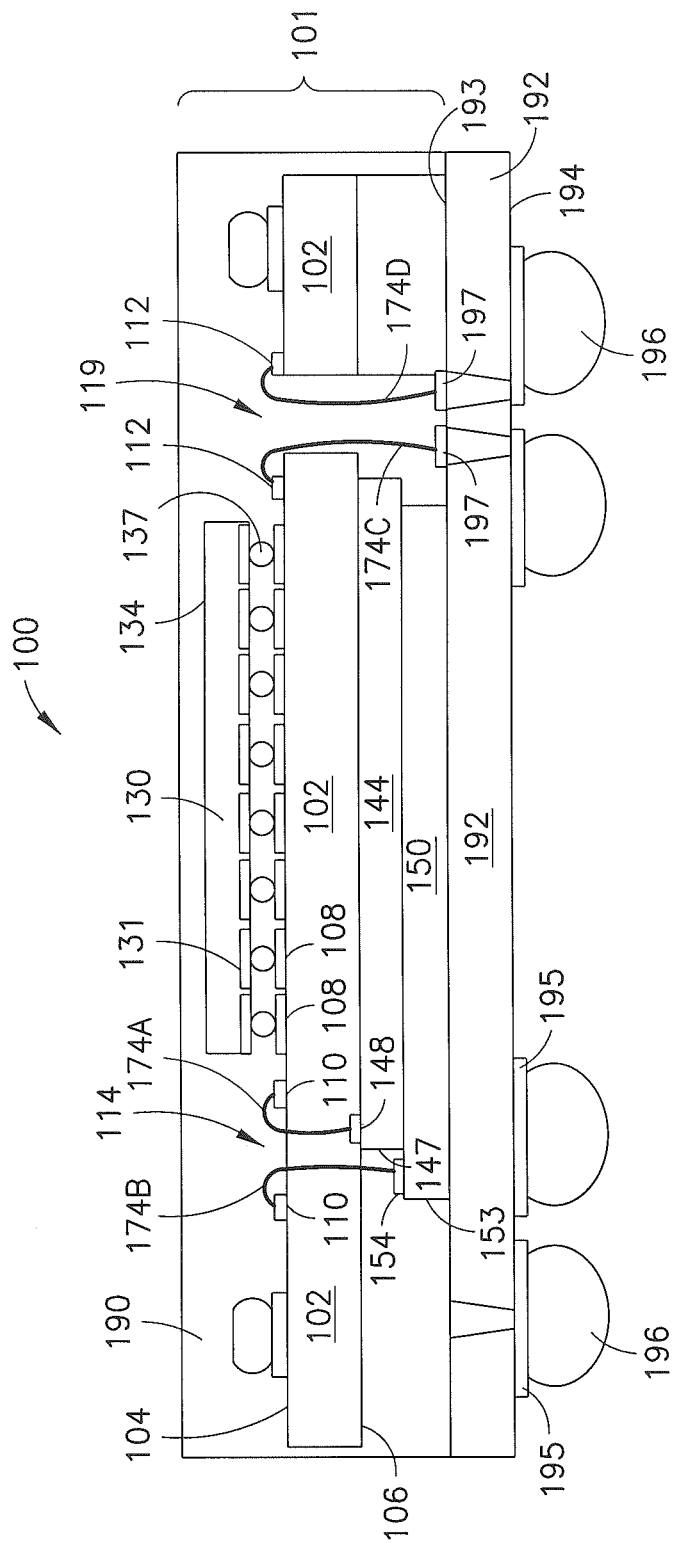
FIG. 1 is a cross-sectional view of a microelectronic package in accordance with one embodiment.

Referring to FIGS. 1-1A, a microelectronic package 100 in accordance with one embodiment is disclosed. Microelectronic package 100 includes a subassembly 101 attached to a substrate 192, a monolithic encapsulant encapsulating the microelectric package 100. In an exemplary embodiment, the subassembly includes at least an element 102, a first microelectronic element 130, and a second microelectronic element 144. Element 102 has a coefficient of thermal expansion of less than 8 parts per million per degree Celsius (hereinafter, "ppm/° C.") and can be used as an interconnection substrate to which other elements, e.g., microelectronic elements such as semiconductor chips, passive devices, e.g., capacitors, resistors or inductors, can be mounted and electrically connected therewith. In particular examples, element 102 can include a bulk layer of semiconductor, glass, or ceramic material on which one or more metal or dielectric layers can be formed. Element 102 of this description can also be referred to as a "low CTE substrate."

Conductive elements are provided in one or more metal layers of the low CTE substrate. Conductive elements include a plurality of first contacts 108 and second contacts 110 exposed at the first surface 104 of element 102 and traces (not shown) which may extend along the first surface 104, and which may or may not be exposed at the first surface. In one embodiment, the plurality of contacts 108 will have a fine pitch of 200 microns or less. Additional electrical features may include vias which electrically connect metal layers of the substrate to one another, when more than one metal layer is present. The conductive elements can be formed from various electrically conductive materials, but most typically are formed from copper, copper alloys, nickel, aluminum, gold, titanium, titanium-tungsten-w, or other alloys of titanium, or combinations of these materials and/or other materials.

As used in this disclosure, an electrically conductive feature can be considered "exposed at" a surface, such as at a surface of a dielectric layer that forms a top surface of a semiconductor chip, if the metallic feature is accessible to a contact or bonding material applied to such surface. Thus, a metallic feature which projects from the surface of the dielectric or which is flush with the surface of the dielectric is exposed at such surface; whereas a recessed conductive feature disposed in or aligned with a hole in the dielectric extending to the surface of the dielectric is also exposed at such surface.

One or more apertures, e.g., slots, may extend between the first surface 104 and second surface 106 of the element 102.

As shown, there may be a first aperture 114 and second aperture 119, but the number of apertures may be fewer or greater depending upon specific design considerations. The apertures may vary in size, but should be at least sufficiently large enough to enable conductive connections, including leads or wire bonds to extend therethrough. In exemplary embodiments, the apertures may be fabricated using low cost techniques such as by machining, ultrasonic drilling, particle blasting, wet etch, or any known techniques.

Microelectronic elements, each of which may be base semiconductor chips, packaged semiconductor chips, or one or more semiconductor chips having an electrically conductive redistribution layer thereon, are attached to both the first and second surfaces 104,106 of the element 102. A first microelectronic element 130, mounted overlying the first surface 104 of the element 102, has a front surface 132 facing the first surface 104 of the element 102 and an opposed rear surface 134. Element contacts 131 exposed at the front surface 132 face first contacts 108 on the first surface 104 and are joined to the first contacts 108 in a flip-chip orientation. For example, electrically conductive bumps 136 made of solder, tin, indium, gold, copper, conductive paste or a conductive matrix material, or other bond metal can join the element contacts of first microelectronic element 130 with the first contacts 108.

One or more second microelectronic elements may overlie the second surface 106 of element 102 and have contacts at the front surface of such second microelectronic element, which are aligned with one or more of the apertures 114, 119. In the example shown, wire bonds 174B can extend through aperture 114 to electrically interconnect element contacts 148 of second microelectronic element 144 with second contacts 110 exposed at the first surface 104 of element 102 and adjacent aperture 114. Any number of additional second microelectronic elements may be provided, such as the one additional second microelectronic element 150 shown in FIG. 1, for example. Wire bonds 174B electrically connect element contacts 154 on the second microelectronic element 150 with second contacts 110 exposed at the first surface 104 of element 102. The second microelectronic elements 144, 150 can be attached to the element 102 or to one another using a bonding material such as an adhesive.

As shown, the respective edges of the second microelectronic elements 144,150 may be staggered or offset, so that at least one edge of each of the second microelectronic elements 144,150 extends beyond the edge of a directly adjacent microelectronic element. Additionally, at least one edge of each of the microelectronic elements 144,150 is aligned with one of the first or second apertures 114,119. In this embodiment, both the first edge 147 of the second microelectronic element 144 and the first edge 153 of the additional second microelectronic element 150 are aligned with the first aperture 114. Wire bonds extending from respective element contacts 147,154 electrically connect with second contacts 110 on the element 102. In alternative embodiments, the second microelectronic elements 144,150 may be arranged so that the element contacts are aligned with the second aperture 119.

The subassembly 101 may be attached to substrate 192 using bonding material, such as an adhesive or the like deposited between the second microelectronic element 150 and the first surface 193 of the substrate 192. Contacts 197 exposed at first surface 193 of the substrate 192 may be electrically connected to third contacts 212 exposed at the first surface 104 of the element 102 using wire bonds 174, 149. In this embodiment, wire bonds 174,149 extend through aperture 119 and connect to third contacts 112 positioned adjacent aperture 119. Terminals 195 exposed at the opposed second surface 194 of substrate 192 may be provided to allow for interconnection to an external device such as a printed circuit board, another microelectronic package, or the like. A bonding material, such as solder balls 196 may be provided on the terminals 195. FIG. 1A is a top plan view of the microelectronic package 100 prior to encapsulation. The wafer subassembly 101 shown in FIG. 1A, a schematic top plan view, may be fully encapsulated. In this example, an encapsulant 190, such as an overmold (FIG. 1), is deposited over the exposed first and second surfaces of the element 102, first microelectronic elements 130, second microelectronic elements 144, 150, each of the wire bonds 174A-D, and through apertures 114,119.

Figure 2:
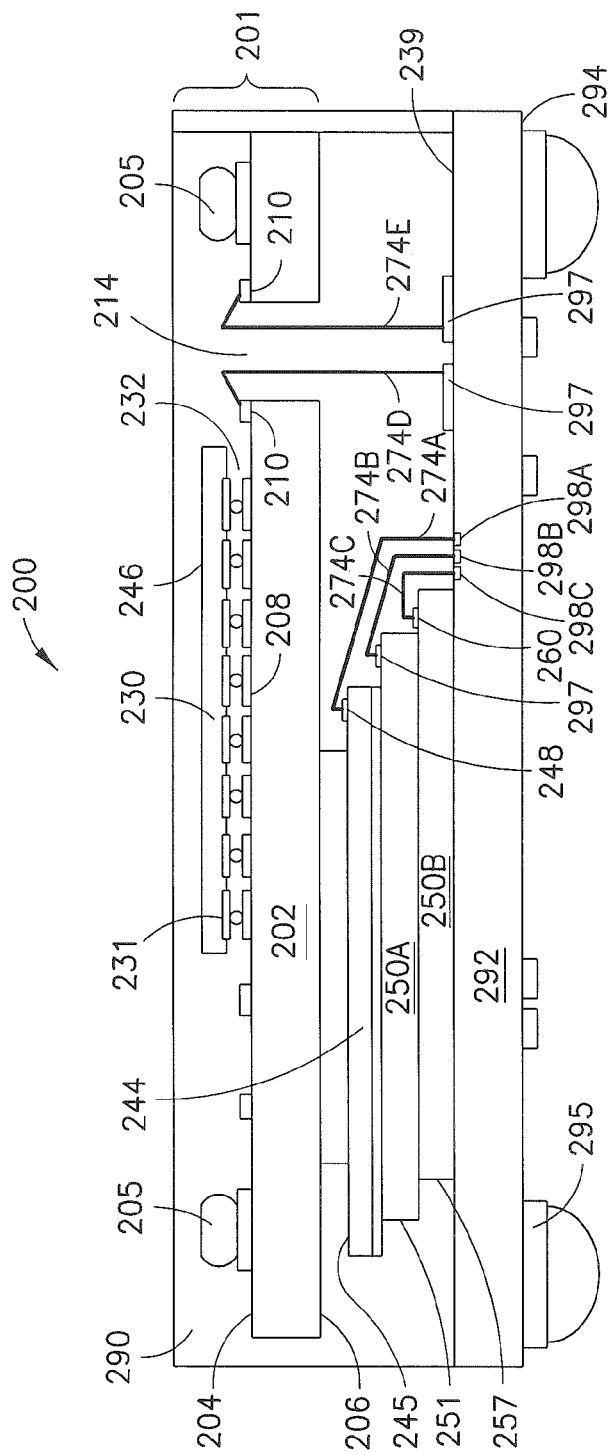
FIG. 2 is a cross-sectional view of a microelectronic package in accordance with one embodiment.
Figure 2A:
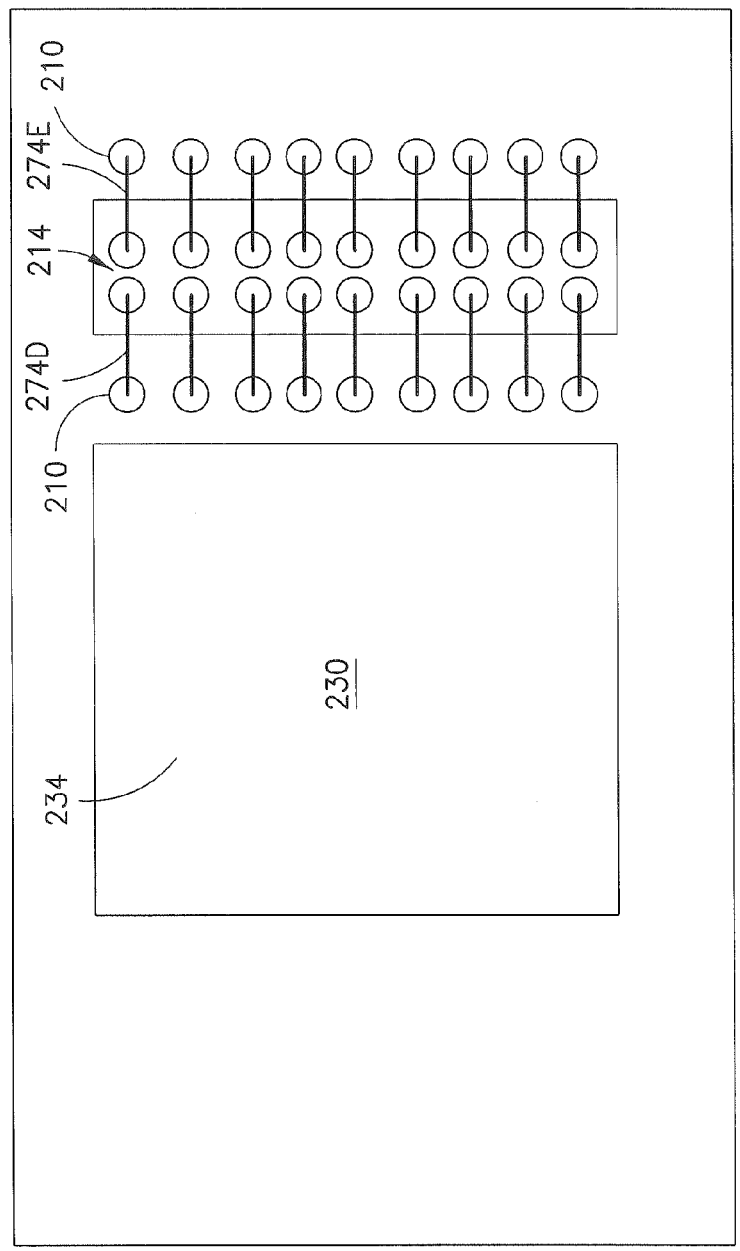
FIG. 2A is a top plan view of FIG. 1.

Referring now to FIGS. 2-2A, a microelectronic package according to an alternative embodiment, is shown. It is to be appreciated that throughout this disclosure, similar reference numerals will be used to represent similar elements. In this embodiment, microelectronic package 200 includes a subassembly 201, a substrate 292 with attached elements, and a monolithic encapsulant 290 that contacts exposed portions of subassembly 201 and substrate 292. As shown, subassembly 201 includes at least element 202 with a first microelectronic element 230, attached thereto. Element 202 has only one aperture 214 extending between first and second surfaces 204, 206. First contacts 208 and second contacts 210 are exposed at a first surface 204 of element 202, and second contacts 210 are positioned adjacent aperture 214.

First microelectronic element 230 overlies element 202 so that front surface 232 of first microelectronic element 230 faces the first surface 204 of element 202. Element contacts 231 exposed at front surface 232 of first microelectronic element 230 are bonded to first contacts 208 using a bonding material, such as solder or the like. Passive components, such as capacitors 205, may also be bonded to the first surface 204 of the element 202.

In one embodiment, subassembly 201 does not include second microelectronic elements stacked on the second surface 206 of element 202. Second microelectronic element 244, as well as another second microelectronic element 250 comprised of two chips 250A,250B, are stacked to overlie the first surface 293 of substrate 292. As shown, the stacked second microelectronic elements 244,250A,250B are attached to each other and the substrate 292. In this example, each of the front surfaces 245,251,257 of the second microelectronic elements face the element 202 but, as will be discussed, are wire bonded to substrate 292. To accommodate the height of the wire bonds extending above the front surface 245 of second microelectronic element 244, a spacer 291 is provided between the element 202 and front surface 245 of second microelectronic element.

In a particular example, second microelectronic elements 244,250A,250B are indirectly electrically connected to element 202, as opposed to being directly wire-bonded to element 202, as disclosed in the previous embodiment. As shown, each of second microelectronic elements 244,250A, 250B are directly connected to substrate 292. In this embodiment, wire bonds extend from respective element contacts 248,254,260 on the respective microelectronic elements 244, 250A,250B to corresponding contacts exposed at the first surface 293 of substrate 292. Wire bonds 274A extend between element contacts 248 exposed at the front surface of the second microelectronic element 244 and contacts 298A exposed at substrate 292; wire bonds 274B extend between element contacts 254 exposed at the front surface 251 of additional second microelectronic element 250A and contacts 298B exposed at substrate 292; and wire bonds 274C extend between element contacts 260 exposed at front surface 257 of the additional second microelectronic element 250B and contacts 298C exposed at substrate 292. There are also wire bonds 274D,274E that electrically connect second contacts 210 on element 202 with contacts 297 exposed at the first surface 293 of substrate 292.

Referring now to FIG. 2A, a schematic top plan view of the microelectronic package 200 prior to encapsulation, exposed rear surface 234 of first microelectronic element 230 is seen, as well as wire bonds 274D-E extending through aperture 214. An encapsulant 290 (FIG. 2), such as an overmold, may be provided over each of the exposed surfaces of the components in the package. Encapsulant 290 covers the subassembly 201, including at least first microelectronic element 230, element 202, and wire bonds 274. Additionally, the encapsulant will cover the exposed components between the first surface 293 of the substrate 292 and the second surface 206 of the substrate 292. In this example, the encapsulant 290 covers or contacts exposed surfaces of the second microelectronic elements 244,250A,250B, and corresponding wire bonds 274A-C. In a particular example, the encapsulant 290 is monolithic and contacts exposed surfaces of the components within the microelectronic package 200.

Figure 3:
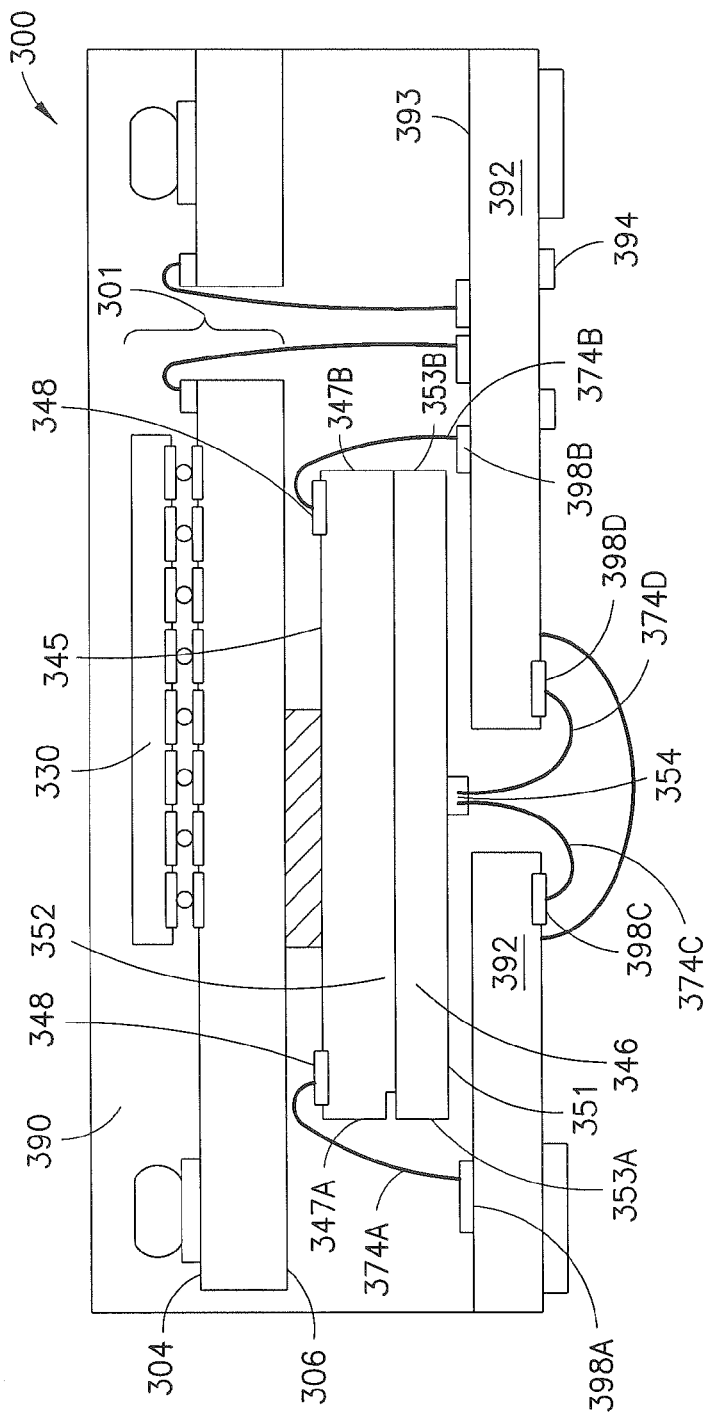
FIG. 3 is a cross-sectional view of an alternative embodiment of FIG. 1.
Figure 4:
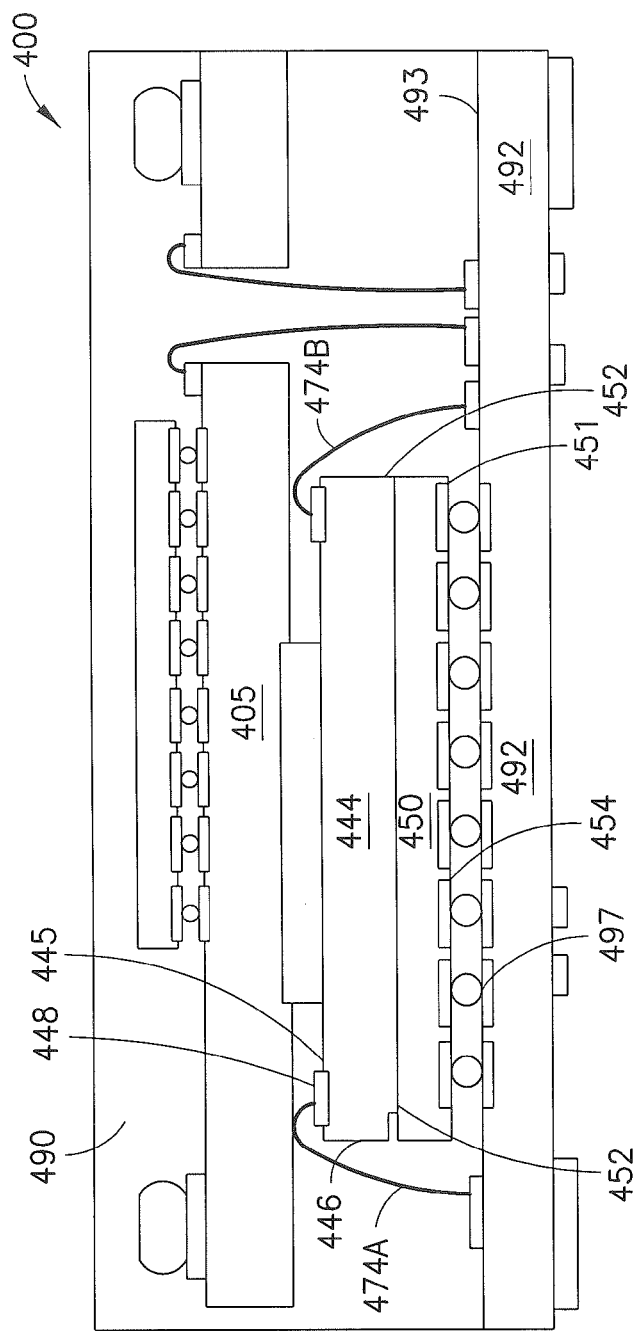
FIG. 4 is a cross-sectional view of an alternative embodiment of FIG. 3.
Figure 5:
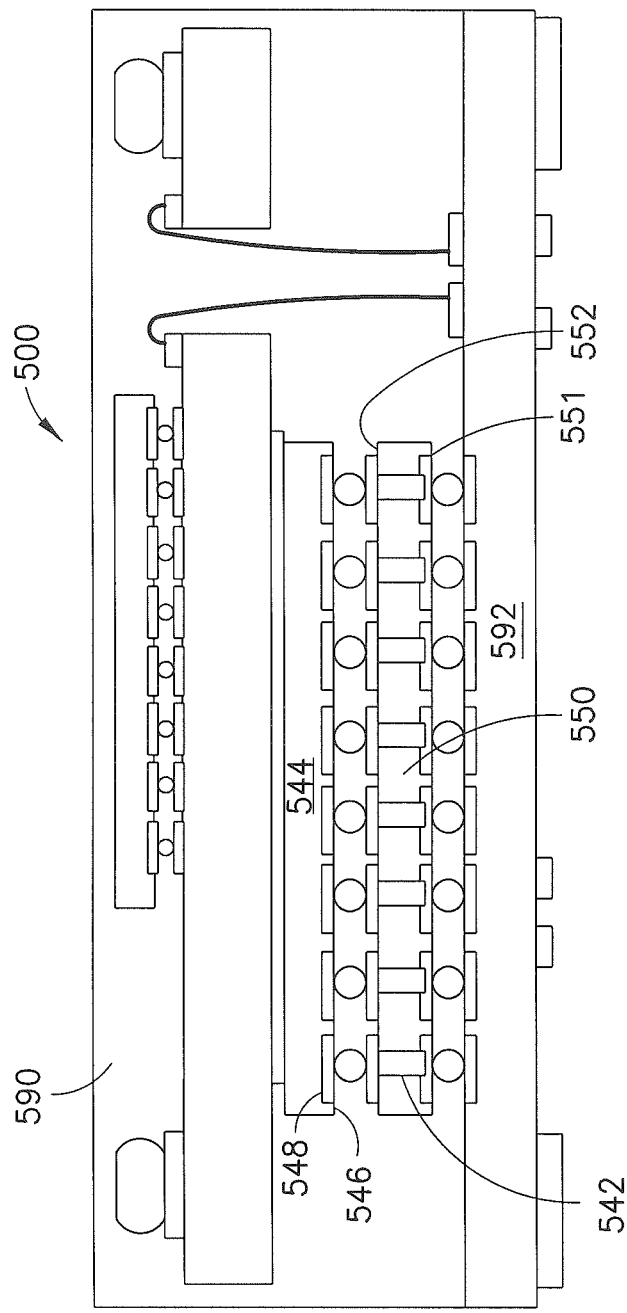
FIG. 5 is a cross-sectional view of an alternative embodiment of FIG. 4.

There are numerous ways in which to arrange the second microelectronic elements within the microelectronic package, including the arrangement of the second microelectronic elements overlying the bottom or second surface of the element. FIGS. 3-5 illustrate a few examples of alternative embodiments, although it is to be appreciated that other arrangements that are not expressly illustrated herein are still contemplated within the scope of the presently disclosed invention.

Referring first to FIG. 3, an alternative embodiment of a packaged microelectronic package 300 is shown. Subassembly 301 includes first microelectronic element 330 overlying element 302. The subassembly 301 may be attached and electrically connected to stacked second microelectronic elements 344,350, and substrate 392 through the use of wire bonds. Exposed surfaces of the microelectronic package 300 can be encapsulated with a monolithic overmold 390 to provide a completed microelectronic packages 300 in accordance with this embodiment.

As shown, the front surface 345 of second microelectronic element 344 has element contacts exposed thereat and faces the second surface 306 of element 302. Rear surface 346 of the second microelectronic element 344 faces the rear surface 352 of the additional second microelectronic element 350. The front surface of the additional second microelectronic element 350 faces first surface 393 of substrate 392. The additional second microelectronic element 350 may be a DRAM chip or the like having element contacts 354 extending along a central portion of the microelectronic element 350.

This microelectronic package 300 only differs from previous embodiments due to the stacked arrangement of second microelectronic elements 344,350 that overlie the second surface 306 of element 302. As shown, the outer edges of the second microelectronic elements 344,350 are not staggered. Outer edges 147A,147B of second microelectronic element 344 are instead aligned with edges 153A,153B of the additional second microelectronic element 350. Both second microelectronic elements 344,350 may be electrically connected to substrate 392 using wire bonds. The second microelectronic element 344 may be electrically connected to the first surface 393 of the substrate 392 using wire bonds 374A, 374B extending from element contacts 348 on second microelectronic element 344 to contacts 398A,398B exposed at the first surface 393 of substrate 392. The additional second microelectronic element 350 can be electrically connected to the second surface 394 of substrate 392. As shown, wire bonds 374C,374D extend from contacts 354 exposed at the front surface 351 of the additional second microelectronic element 350 to contacts 398C,398D exposed at the second surface 394 of substrate 392. This particular stacked arrangement allows for the incorporation of a center-bonded microelectronic element 350 into the microelectronic package 300.

Turning now to FIG. 4, an alternative embodiment of FIG. 3, a microelectronic package 400 is shown. As in the previous embodiments, the front surface 445 of the second microelectronic element 444 faces element 402, and the front surface 451 of the additional second microelectronic element 450 faces the first surface 493 of substrate 492. The rear surface 452 of the additional second microelectronic element 450 may be attached to the rear surface 446 of the second microelectronic element 444. Element contacts 448 exposed at the front surface 445 of the second microelectronic element 444 may be electrically connected to the substrate 492 via wire bonds 474A, 474B extending therebetween.

This embodiment differs from the previous embodiments due to the stacked arrangement of the second microelectronic elements 444,450 that overlies substrate 492. Instead of the additional second microelectronic element 450 being a D-RAM or center-bonded chip, the additional second microelectronic element 450 has element contacts 454 extending along its front surface 451. This allows additional second microelectronic element 450 to be bonded in a flip-chip orientation to contacts 497 on the first surface 493 of substrate 492. A monolithic encapsulant 490 may be provided between the first surface 493 of the substrate 492 and the element 402, as well as over the first surfaces of the element 402 and the surfaces of the devices thereon.

With reference to FIG. 5, microelectronic package 500 in accordance with an alternative embodiment of FIG. 4 is shown. In this embodiment, both second microelectronic element 544,550 are mounted and electrically connected to the substrate 592 in a flip-chip orientation. The front surface 545 of the second microelectronic element 544 may face the rear surface 552 of the additional second microelectronic element 550. Conductive vias 542 extending between the front and rear surfaces 551,552 of the additional second microelectronic element 550 allow for the second microelectronic element 544 to be electrically connected to the substrate 592. Element contacts 548 exposed at the front surface 545 of the second microelectronic element 544 may be electrically connected to conductive vias 542. This can allow for electrical interconnection between the element contacts 548 and substrate 592. A monolithic encapsulant 590, such as overmold, may be provided over exposed surfaces.

Figure 6:
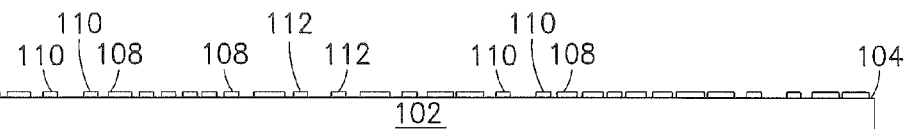
FIGS. 6, 6A, 6B, 6C, 6D, and 6E illustrate cross-sectional views of a method of forming a microelectronic package of FIG. 1, in accordance with one embodiment.
Figure 6A:
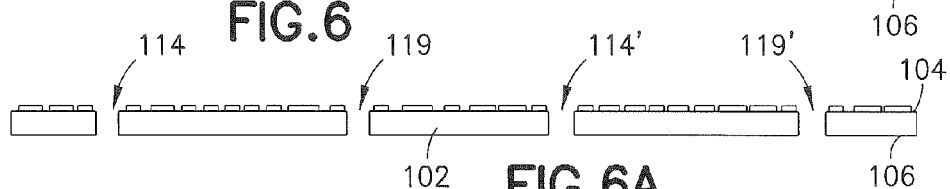
Figure 6B:
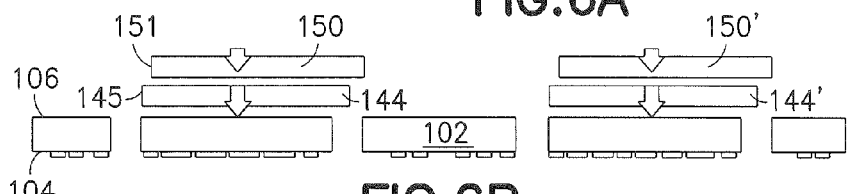
Figure 6C:
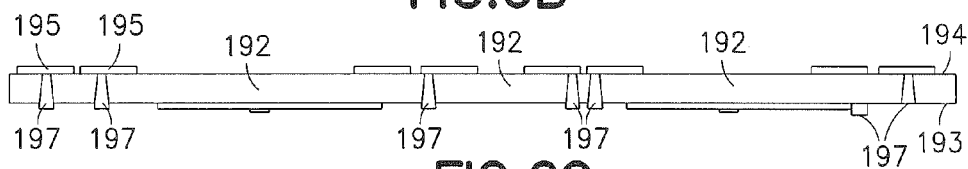
Figure 6D:
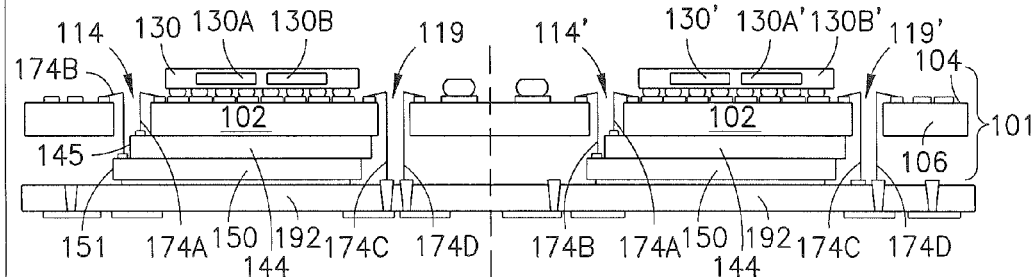
Figure 6E:
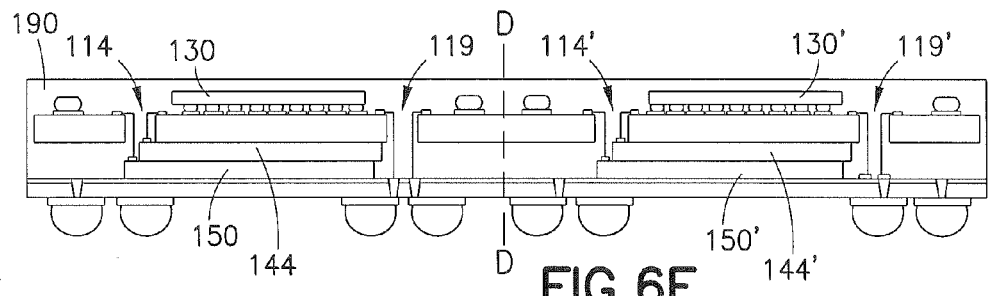

Referring now to FIGS. 6-6E, a method of making the microelectronic package of FIG. 1, in accordance with one embodiment, is shown. As shown in FIG. 6, an element 102 is provided with a plurality of contacts, such as first contacts 108, second contacts 110, and third contacts 112 exposed at a first surface 104. Openings 114,119,114',119' are created between the first surface and second surface, as shown in FIG. 6A. In one embodiment, element 102 may be inverted and a series of one or more second microelectronic elements may be attached thereto. Second microelectronic element 144 may be arranged to overlie the second surface 106 of the element 102. In this embodiment, second microelectronic element 144 is attached to the second surface 106 of element 102 using a die attach, such as an adhesive (not shown). Another second microelectronic element 150 may be attached to the rear surface of second microelectronic element 144. The additional second microelectronic element 150 should be positioned so that outer edge 145 of the second microelectronic element 144 and the outer edge 151 of the additional second microelectronic element 150 are staggered and do not directly overlie one another. Another set of second microelectronic elements 144',150' may also be attached to element 102 in the same manner. In this embodiment, if desired, once the second microelectronic elements 144,144',150,150' are attached to element 102, the integrity of second microelectronic elements 144,144',150,150' can be tested. This can help to ensure the integrity of the second microelectronic elements 144,144',150,150' prior to the assembly of the final microelectronic package, at which point it is more costly to discover the error and replace defective or damaged microelectronic elements.

Turning to FIG. 6C, substrate 192 is prepared with terminals on a second surface 194 and contacts 197 on the opposed first surface 193. The substrate 192 and element 102 with attached second microelectronic elements 144,150 are both inverted. Substrate 192 is then attached to the rear surfaces of the additional second microelectronic elements 150,150'.

Referring now to FIG. 6D, first microelectronic element 130 may then be provided on the first surface 102 of element 102. In this embodiment, first microelectronic element 130 may be comprised of two chips 130A',130B' that are arranged to overlie the first surface 104 of the element 104 in a flip-chip orientation. In this embodiment, first microelectronic element 130 is comprised of two semiconductor chips 130A, 130B, although one or more than two semiconductor chips may be utilized. Additionally, the one or more first microelectronic elements 130 may be arranged in any configuration over the element 102, including, without limitation, a stacked configuration. In an exemplary example, first microelectronic element 130 is tested prior to its assembly onto element 102 to avoid the cost of discovering a damaged or defective microelectronic element after the final assembly of the microelectronic package 100 (FIG. 1). Testing of any of the microelectronic elements in the package can, of course, be conducted at any desired time.

Wire bonds may be incorporated into the package to provide an electrical interconnection between and among the first microelectronic elements 130,130', second microelectronic elements 144,150,144',150', substrate 192, and element 102. As shown, each of wire bonds 174A,174A' extend through respective apertures 114,114'. wire bonds 174B, 174B' also extend through respective apertures 114,114' These wire bonds connect second microelectronic elements 144,150 and 144',150' with the first surface 104 of the element 102. Additionally, wire bonds 174C,174D and 174C',174D' extend through respective apertures 119,119' to directly connect substrate 192 with element 102.

Finally, with reference to FIG. 6E, an encapsulant 190 may be provided over the exposed surfaces of components that are provided between the second surface 106 of the element 102 and first surface 193 of substrate 192. Additionally, encapsulant 190 may cover exposed surfaces of the element 102, components overlying the first surface 104, wire bonds, and apertures 114,114',119,119'. Once the encapsulant 190 is cured, the wafer package may be cut along dicing line D-D, to provide the individual microelectronic package 100 shown in FIG. 1.

Figure 7:
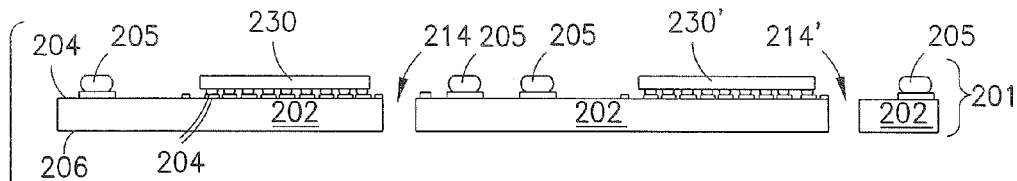
FIGS. 7, 7A, 7B, and 7C illustrate cross-sectional views of a method of forming a microelectronic package of FIG. 2 in accordance with one embodiment.
Figure 7A:
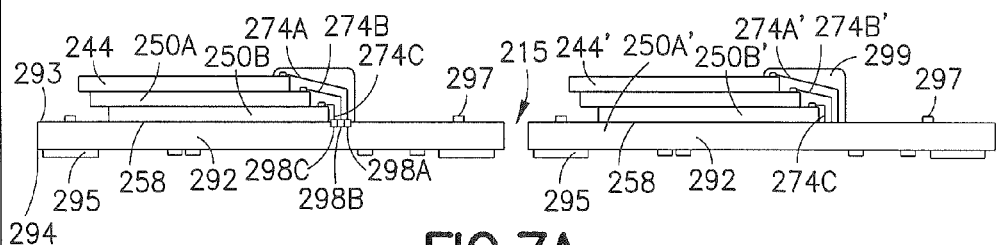
Figure 7B:
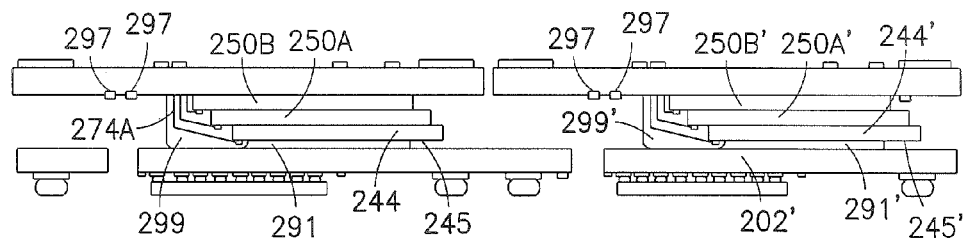
Figure 7C:
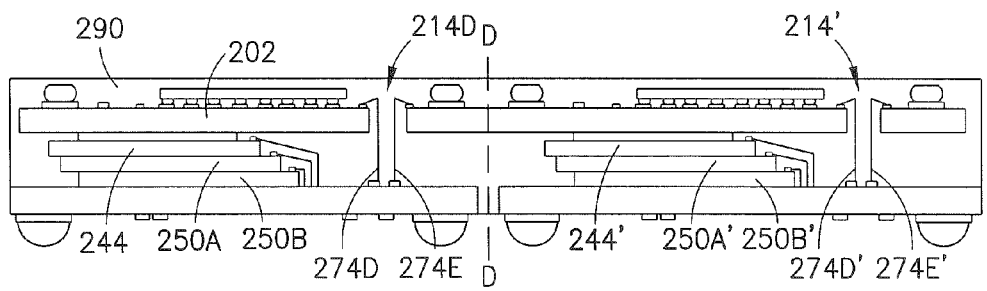

Turning now to FIGS. 7-7C, a method of making the microelectronic package shown in FIG. 2, in accordance with one embodiment is shown. Subassembly 201 is shown in FIG. 7, which is comprised of element 202 with apertures 214,214' extending therethrough and first microelectronic elements 230,230' electrically connected to contacts 208 exposed at the first surface 204 of element 202. Passive elements, such as capacitors 205 may also be provided on first surface 204 of element 202.

Turning to FIG. 7A, a substrate 292 is provided with one aperture 214 extending therethrough, contacts 297 exposed at a first surface of substrate 292, and terminals 295 exposed at a second surface of substrate 292. Stacked second microelectronic elements 244,250A,250B may be provided on the first surface 293 of substrate 292. Rear surface 258 of additional second microelectronic element 250B may be attached to first surface 293 of substrate 292 using a form of die attach, such as an adhesive (not shown). In this embodiment, as previously discussed, second microelectronic elements 244,250A,250B are arranged so that the edges 247, 253, 259 of each of the respective second microelectronic elements 244,250A,250B are staggered to allow for element contacts 248, 254, and 260 to be exposed. Wire bonds 274A,274B,274C extend from respective element contacts 248,254, and 260 to contacts exposed at the first surface 293 of substrate 292. An encapsulant 290 may be provided over each of the wire bonds 274A,274B,274C. This identical arrangement can be utilized for the arrangement of second microelectronic elements 244', 250A',250B'.

With reference now to FIG. 7B, substrate 292 with attached second microelectronic elements 244,250A,250B, and 244', 250A',250B' may be inverted and attached to second surface 206 of element 202. In this embodiment, spacers 291,291' may be provided between second surface 206 and front surfaces 245,245' of second microelectronic elements 244,244'. Spacers 291,291' can provide space for the height of wire bond 274A. Encapsulant 290,290' can also be attached to second surface 206 of element 202. Apertures 214, 214' should be aligned with contacts 297 exposed at the first surface 293 of substrate 292.

Turning to FIG. 7C, element 202 may be electrically connected to contacts 297 through wire bonds 274D,274D',274E, 274E' that extend through apertures 214,214'. The assembly may then be cut through line D-D to provide the individual microelectronic package 200 shown in FIG. 2.

Figure 8:
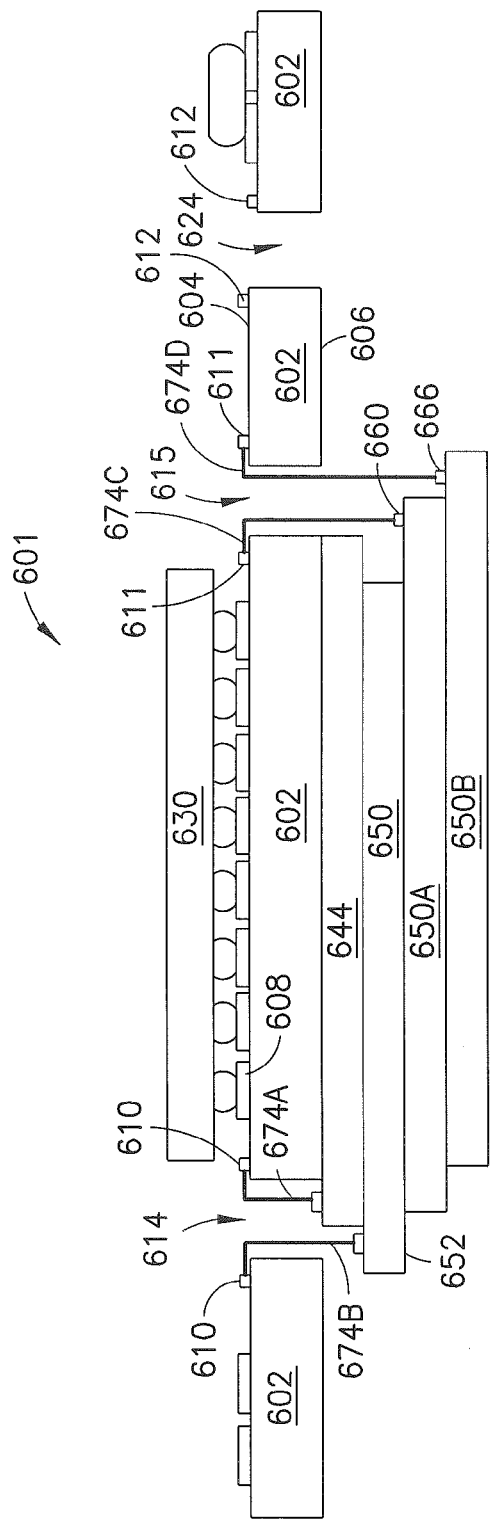
FIG. 8 is an alternative embodiment of a subassembly shown in FIG. 1.

Referring now to FIG. 8, an alternative subassembly 601 of the subassembly 101, shown in FIG. 1, is described. The subassembly 601 is similar to the subassembly 101, shown in FIG. 1, to the extent that it includes an element 602 with a first microelectronic element 630 electrically connected to contacts 108 exposed at the first surface 604 of element 602, and second microelectronic elements 644, 650 wire bonded through aperture 614 to contacts 610 exposed at the first surface of element 602. In this alternative embodiment, element 602 of the subassembly 601 further includes a second aperture 615 and third aperture 624. There are also additional second microelectronic elements 650A,650B attached in a face-up orientation to the rear surface 652 of second microelectronic element 650. The additional second microelectronic elements 650A,650B are staggered so that element contacts 660, 666 of second microelectronic elements 650A, 650B can be aligned with aperture 615 in element 602. Wire bonds 674C, 674D extend through aperture 615 to electrically connect respective element contacts 660,666 with contacts 611 exposed at the first surface of element 602. Another set of contacts 612 exposed at the first surface of element 602 can be used to electrically connect element 602 with a substrate (not shown) when it is desired to incorporate subassembly 601 into a microelectronic package.

Figure 9:
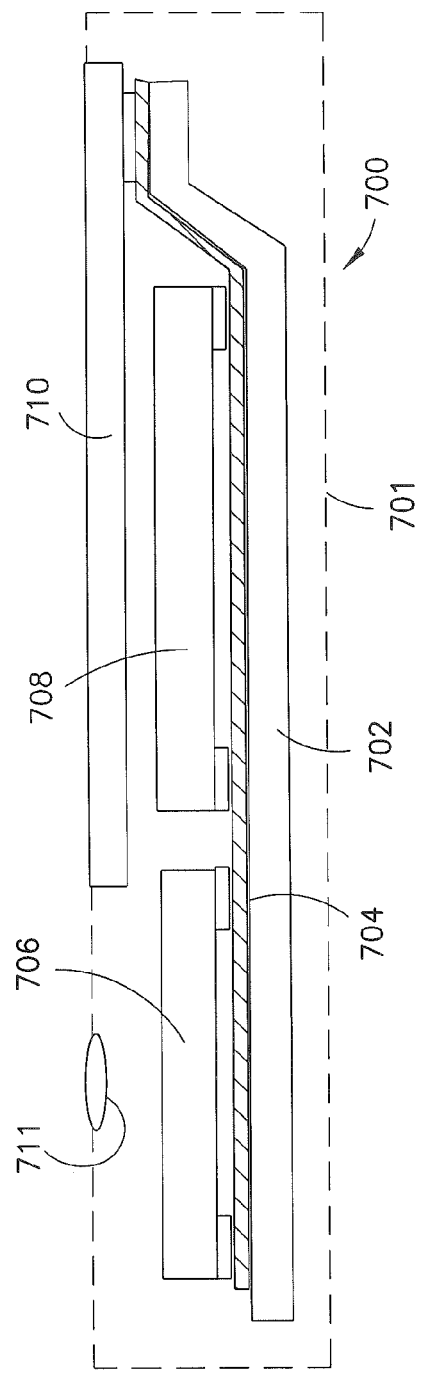
FIG. 9 is a cross-sectional view of a system incorporating an interconnection element.

The various microelectronic assemblies discussed above can be utilized in construction of diverse electronic systems. For example, referring to FIG. 9, a system 1000 in accordance with a further embodiment of the invention includes a structure 706 as described in the prior embodiments of microelectronic packages above in conjunction with other electronic components 708 and 710. In the example depicted, component 708 is a semiconductor chip whereas component 710 is a display screen, but any other components can be used. Of course, although only two additional components are depicted in FIG. 9 for clarity of illustration, the system may include any number of such components. The structure 706 as described above may be, for example, a composite chip or a structure incorporating plural chips. In a further variant, both may be provided, and any number of such structures may be used. Structure 706 and components 708 and 710 are mounted in a common housing 701, schematically depicted in broken lines, and are electrically interconnected with one another as necessary to form the desired circuit. In the exemplary system shown, the system includes a circuit panel 702 such as a flexible printed circuit board, and the circuit panel includes numerous conductors 704, of which only one is depicted in FIG. 5, interconnecting the components with one another. However, this is merely exemplary; any suitable structure for making electrical connections can be used. The housing 701 is depicted as a portable housing of the type usable, for example, in a cellular telephone or personal digital assistant, and screen 710 is exposed at the surface of the housing. Where structure 706 includes a light-sensitive element such as an imaging chip, a lens 711 or other optical device also may be provided for routing light to the structure. Again, the simplified system shown in FIG. 9 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
   a subassembly including:
   a first substrate having a coefficient of thermal expansion (CTE) of eight parts per million per degree Celsius or less, the substrate having a first surface, a second surface opposite the first surface, and an aperture extending between the first and second surfaces thereof, the first surface having discrete first contacts and second contacts thereon, the first contacts having a pitch of 200 microns or less;
   a first microelectronic element having a front surface facing the first surface and first element contacts at the front surface joined to the first contacts;
   a second substrate underlying either the first or the second surfaces of the first substrate and electrically interconnected with the first substrate by wire bonds only to the second contacts extending through the aperture, the second substrate having terminals configured for electrically connection to a component external to the microelectronic package;
   a second microelectronic element electrically interconnected with the second substrate; and
   a monolithic encapsulant contacting the first and second microelectronic elements and the first and second substrates.

2. The microelectronic package as claimed in claim 1, wherein the second microelectronic element has a front surface facing the first microelectronic element and wire bonds electrically connecting the second microelectronic element with the first substrate.

3. The microelectronic package as claimed in claim 1, wherein the second microelectronic element has a front surface facing the first microelectronic element and wire bonds electrically connecting the second microelectronic element with the second substrate.

4. The microelectronic package as claimed in claim 1, further comprising a third microelectronic element having a front surface and a rear surface, the front surface of the third microelectronic element facing the first substrate and electrically connected to the first substrate.

5. The microelectronic package as claimed in claim 4, wherein a wire bond electrically connects the third microelectronic element with the first substrate.

6. A system comprising a microelectronic package according to claim 1, and one or more other electronic components electrically connected with the assembly.

7. A system as claimed in claim 6 further comprising a housing, the package and the other electronic components being mounted to the housing.

8. A microelectronic package, comprising:
a subassembly including:
a first substrate having a coefficient of thermal expansion (CTE) of eight parts per million per degree Celsius or less, the substrate having a first surface, a second surface opposite the first surface, and an aperture extending between the first and second surfaces thereof, and the first surface having discrete first contacts and second contacts thereon, the first contacts having a pitch of 200 microns or less;
a first microelectronic element having a front surface facing the first surface and first element contacts at the front surface joined to the first contacts;
a second substrate underlying either the first or the second surfaces of the first substrate and electrically interconnected with the first substrate by wire bonds only to the second contacts extending through the aperture, the second substrate having terminals configured for electrically connection to a component external to the microelectronic package;
a second microelectronic element electrically interconnected with the second substrate, the second microelectronic element having conductive vias extending between its front and rear surfaces;
a monolithic encapsulant contacting the first and second microelectronic elements and the first and second substrates; and
a third microelectronic element having a front surface and a rear surface, the third microelectronic element being electrically connected to the second substrate through the conductive vias.

9. The microelectronic package as claimed in claim 8, wherein the second microelectronic element has a front surface facing the first microelectronic element and wire bonds electrically connect the second microelectronic element with the first substrate.

10. The microelectronic package as claimed in claim 8, wherein the second microelectronic element has a front surface facing the first microelectronic element and wire bonds electrically connecting the second microelectronic element with the second substrate.

11. The microelectronic package as claimed in claim 8, wherein a wire bond electrically connects the third microelectronic element with the first substrate.

12. A system comprising a microelectronic package according to claim 8, and one or more other electronic components electrically connected with the assembly.

13. A system as claimed in claim 12, further comprising a housing, the package and the other electronic components being mounted to the housing.

* * * * *